United States Patent
Park et al.

(10) Patent No.: US 10,104,777 B2
(45) Date of Patent: Oct. 16, 2018

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Min Cheol Park, Suwon-si (KR); Hwi Dae Kim, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/392,160

(22) Filed: Dec. 28, 2016

(65) Prior Publication Data

US 2017/0367186 A1  Dec. 21, 2017

(30) Foreign Application Priority Data

Jun. 21, 2016  (KR) ........................ 10-2016-0077391

(51) Int. Cl.
| | |
|---|---|
| *H05K 1/18* | (2006.01) |
| *H01G 4/005* | (2006.01) |
| *H01G 4/12* | (2006.01) |
| *H01G 4/236* | (2006.01) |
| *H01G 4/30* | (2006.01) |

(Continued)

(52) U.S. Cl.
CPC ............. *H05K 1/181* (2013.01); *H01G 4/005* (2013.01); *H01G 4/12* (2013.01); *H01G 4/236* (2013.01); *H01G 4/30* (2013.01); *H05K 1/111* (2013.01); *H05K 3/3442* (2013.01); *H05K 2201/10015* (2013.01)

(58) Field of Classification Search
CPC .. H05K 1/18; H01G 4/05; H01G 4/06; H01G 4/12; H01G 4/30; H01G 4/228; H01G 4/255; H01G 15/00
USPC ........... 174/260, 258; 361/272, 301.4, 306.2, 361/306.3, 303, 313, 767.782
See application file for complete search history.

(56) References Cited

U.S. PATENT DOCUMENTS 6,327,134 B1 * 12/2001 Kuroda ................. H01G 4/232
                                                              361/303
7,251,115 B2   7/2007 Togashi
(Continued)

FOREIGN PATENT DOCUMENTS

JP     2010-177572 A    8/2010
KR   10-2007-0052656 A  5/2007
(Continued)

OTHER PUBLICATIONS

Korean Office Action issued in corresponding Korean Application No. 10-2016-0077391, dated Jun. 13, 2017; with English translation.

*Primary Examiner* — Xiaoliang Chen
(74) *Attorney, Agent, or Firm* — McDermott Will & Emery LLP

(57) ABSTRACT

A multilayer capacitor include dielectric layers stacked in a direction perpendicular to a mounting surface of a capacitor body, and internal electrodes and an equivalent series inductance (ESL) control pattern formed on upper and lower portions of the dielectric layers, respectively. The internal electrodes have an area larger than that of the ESL control pattern, and the ESL control pattern is exposed to a mounting surface of a capacitor body.

9 Claims, 9 Drawing Sheets

(51) Int. Cl.
*H05K 1/11* (2006.01)
*H05K 3/34* (2006.01)

(56) References Cited

U.S. PATENT DOCUMENTS

| | | | |
|---|---|---|---|
| 7,688,568 B1* | 3/2010 | Lee | H01G 4/232 |
| | | | 361/303 |
| 9,653,212 B2* | 5/2017 | Lee | H01G 4/30 |
| 9,728,334 B2* | 8/2017 | Lee | H01G 4/12 |
| 2006/0250747 A1* | 11/2006 | Takashima | H01G 4/12 |
| | | | 361/272 |
| 2007/0109717 A1 | 5/2007 | Lee et al. | |
| 2007/0279836 A1* | 12/2007 | Takashima | H01G 4/30 |
| | | | 361/306.3 |
| 2008/0186652 A1* | 8/2008 | Lee | H01G 4/012 |
| | | | 361/306.3 |
| 2009/0059469 A1* | 3/2009 | Lee | H01G 4/012 |
| | | | 361/306.2 |
| 2009/0139757 A1* | 6/2009 | Lee | H01G 4/005 |
| | | | 174/260 |
| 2009/0244803 A1 | 10/2009 | Lee et al. | |
| 2010/0091427 A1* | 4/2010 | Lee | H01G 4/232 |
| | | | 361/306.3 |
| 2010/0254070 A1* | 10/2010 | Lee | H01G 4/012 |
| | | | 361/306.3 |
| 2010/0321860 A1* | 12/2010 | Osawa | H01G 4/012 |
| | | | 361/303 |
| 2011/0096463 A1* | 4/2011 | Togashi | H01G 4/228 |
| | | | 361/306.3 |
| 2011/0096464 A1* | 4/2011 | Togashi | H01G 4/228 |
| | | | 361/306.3 |
| 2015/0114702 A1* | 4/2015 | Lee | H01G 2/065 |
| | | | 174/260 |
| 2015/0243438 A1* | 8/2015 | Ahn | H01G 4/012 |
| | | | 174/258 |
| 2015/0318113 A1* | 11/2015 | Kim | H01G 4/232 |
| | | | 174/260 |
| 2015/0318114 A1* | 11/2015 | Ahn | H01G 4/012 |
| | | | 174/260 |
| 2015/0325372 A1* | 11/2015 | Lee | H01G 4/30 |
| | | | 174/260 |
| 2015/0373852 A1* | 12/2015 | Ahn | H01G 4/30 |
| | | | 361/301.4 |
| 2016/0027593 A1* | 1/2016 | Ahn | H01G 4/38 |
| | | | 361/301.4 |
| 2016/0027594 A1* | 1/2016 | Ahn | H05K 3/3442 |
| | | | 361/767 |
| 2016/0381802 A1* | 12/2016 | Taniguchi | H01G 4/008 |
| | | | 174/260 |
| 2017/0062129 A1* | 3/2017 | Lee | H01G 2/065 |
| 2017/0062133 A1* | 3/2017 | Lee | H01G 4/30 |

FOREIGN PATENT DOCUMENTS

| | | |
|---|---|---|
| KR | 10-2009-0117686 A | 11/2009 |
| KR | 10-0935994 B1 | 1/2010 |

\* cited by examiner

MULTILAYER CAPACITOR AND BOARD HAVING THE SAME

CROSS-REFERENCE TO RELATED APPLICATION(S)

This application claims the benefit of priority to Korean Patent Application No. 10-2016-0077391, filed on Jun. 21, 2016 in the Korean Intellectual Property Office, the entire disclosure of which is incorporated herein by reference.

TECHNICAL FIELD

The present disclosure relates to a multilayer capacitor and a board having the same.

BACKGROUND

A multilayer ceramic capacitor (MLCC), a multilayer electronic component, may be used in various electronic apparatuses due to advantages thereof, such as its small size, high capacitance, and ease of mountability.

For example, the multilayer capacitor may be used as a chip type condenser mounted on circuit boards of several electronic products, such as display devices, including liquid crystal displays (LCDs), plasma display panels (PDPs), and the like, computers, personal digital assistants (PDAs), and mobile phones, and serving to charge and discharge electricity.

Recently, as the operating frequency of a microprocessor unit (MPU) has been continuously increased, and functions thereof have also been added, current consumption of the MPU has been continuously increased, and use voltage has gradually decreased.

Therefore, it has become gradually more difficult to suppress the noise of a supplied direct current (DC) voltage to be within a predetermined range, in accordance with rapid changes in load currents, and, as a means for removing the noise of the voltage, a decoupling multilayer capacitor has been widely used in a power distribution network (PDN) of the MPU.

A multilayer capacitor used as the decoupling capacitor supplies a current to a central processing unit (CPU) (MPU chip) when the load current is rapidly changed, thereby serving to suppress the noise of the voltage, and various capacitors, including a high capacitor and a low equivalent series inductance (ESL) capacitor, of which self-resonance frequencies (SRFs) are different from each other due to different capacitances and ESL values, have been used in plural.

However, it is only when the ESL of the decoupling capacitor is low that the noise of the voltage may be efficiently decreased, but when a plurality of capacitors are used as described above, equivalent series resistance (ESR) is excessively decreased, such that impedance may be increased by anti-resonance between the capacitors.

Further, recently, the size of an entire mounting space has decreased due to miniaturization of a chipset, and, in the case of using the plurality of capacitors, a difficulty in designing a chip may be increased due to a lack of mounting space, and it may be difficult to manufacture the chip due to an increase in the number of external electrodes.

SUMMARY

An aspect of the present disclosure may provide a multilayer capacitor having a decreased mounting space at the time of being mounted on a circuit board, and having low ESL characteristics at a high frequency, to thereby easily control a noise of a voltage, and a board having the same.

According to an aspect of the present disclosure, a multilayer capacitor includes dielectric layers stacked in a direction perpendicular to a mounting surface, and internal electrodes and an equivalent series inductance (ESL) control pattern are formed on upper and lower portions of the dielectric layers, respectively. The internal electrodes have an area larger than that of the ESL control pattern, and the ESL control pattern is exposed to the mounting surface of a capacitor body to implement relatively low ESL, and a board having the same may be provided.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Directions of a hexahedron will be defined in order to clearly describe exemplary embodiments in the present disclosure. X, Y and Z illustrated in the accompanying drawings refer to a length direction, a width direction, and a thickness direction of a capacitor body, respectively.

Multilayer Capacitor

Figure 1:
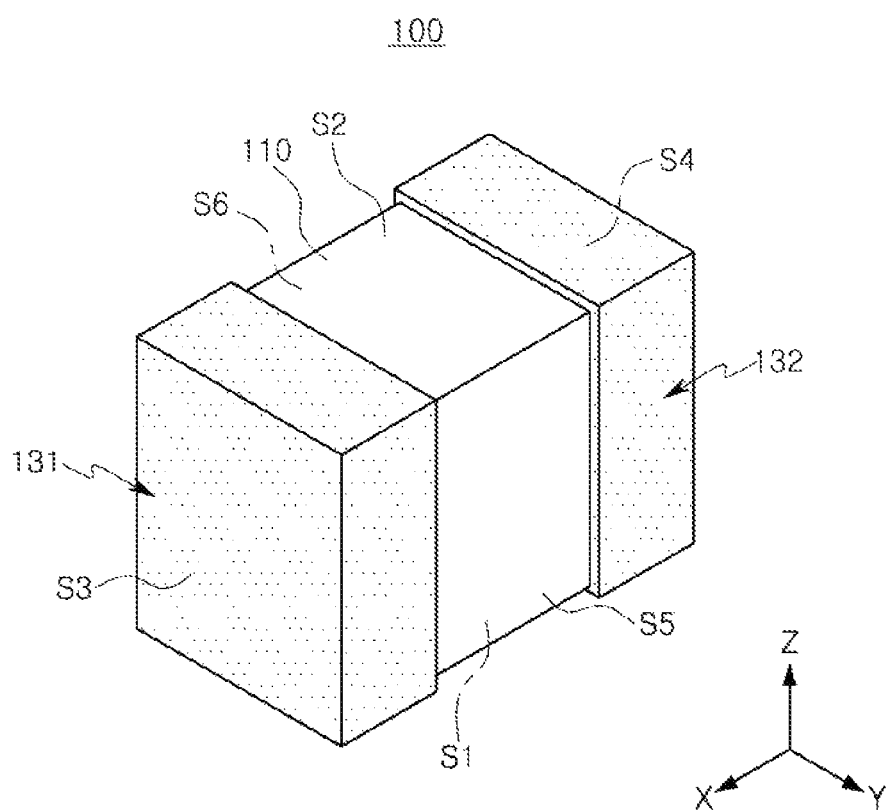
FIG. 1 is a perspective view schematically illustrating a multilayer capacitor according to an exemplary embodiment in the present disclosure.
Figure 2A:
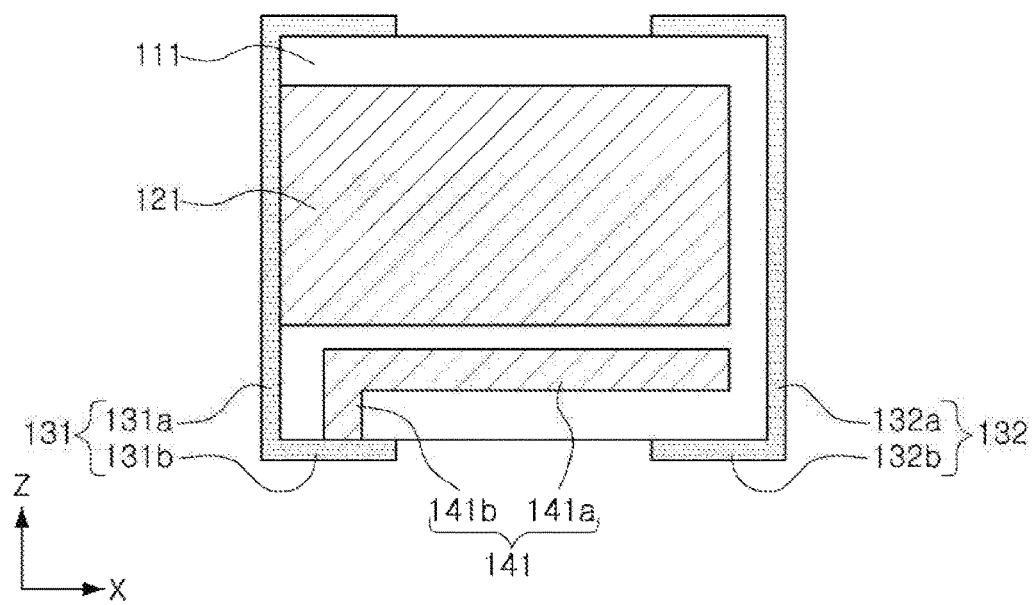
FIGS. 2A and 2B are cross-sectional views illustrating first and second internal electrodes and first and second ESL control patterns used in the multilayer capacitor of FIG. 1.
Figure 2B:
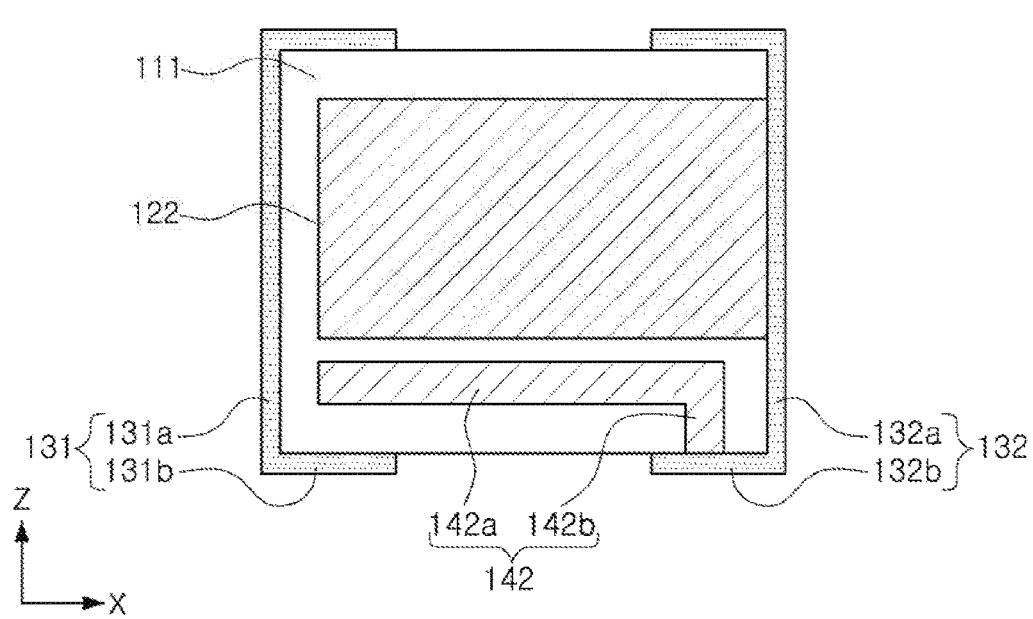
Figure 3:
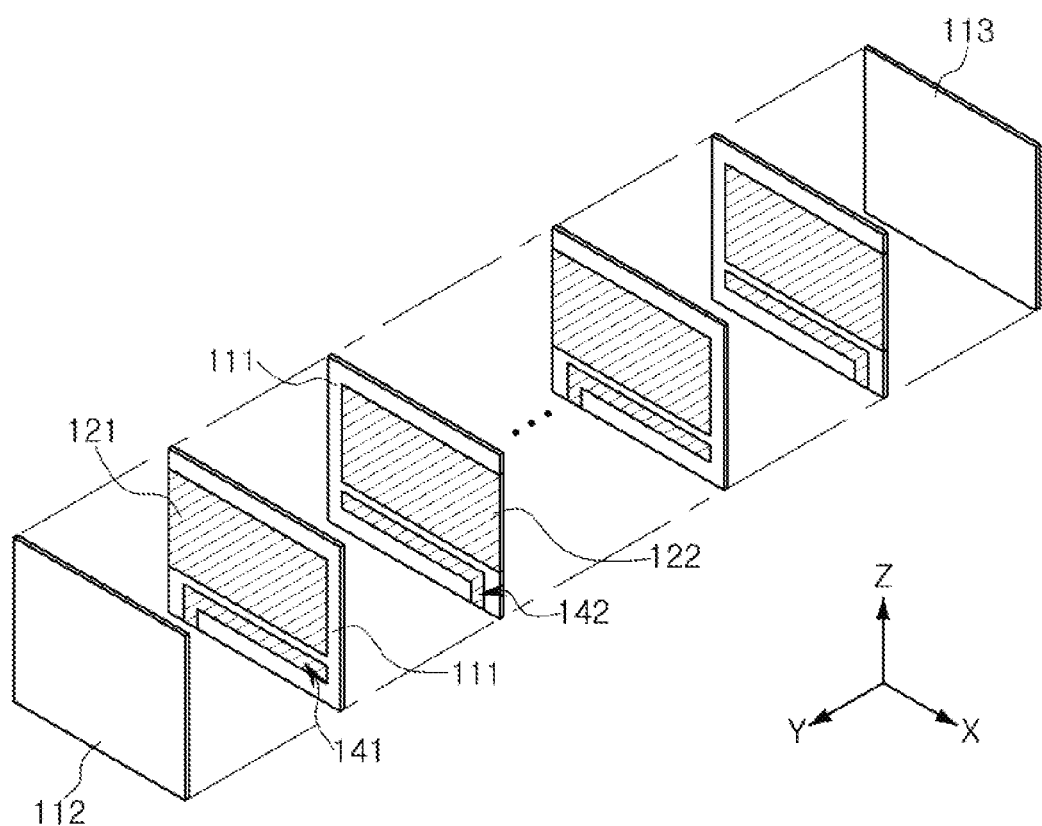
FIG. 3 is a separated perspective view illustrating a stacked structure of the internal electrodes and the ESL control patterns in the multilayer capacitor of FIG. 1.

FIG. 1 is a perspective view schematically illustrating a multilayer capacitor according to an exemplary embodiment in the present disclosure, FIGS. 2A and 2B are cross-sectional views illustrating first and second internal electrodes and first and second ESL control patterns used in the multilayer capacitor of FIG. 1, and FIG. 3 is a separated perspective view illustrating a stacked structure of the internal electrodes and the ESL control patterns in the multilayer capacitor of FIG. 1.

A multilayer capacitor 100 according to the present exemplary embodiment may include a capacitor body 110, first and second external electrodes 131 and 132, first and second internal electrodes 121 and 122, and first and second equivalent series inductance (ESL) control patterns 141 and 142.

The capacitor body 110 may be formed by stacking a plurality of dielectric layers 111 in the Y direction and then sintering the stacked dielectric layers 111, and the respective adjacent dielectric layers 111 may be integrated with each other so that boundaries therebetween are not readily apparent.

Here, the capacitor body 110 as described above may have a hexahedral shape.

In the present exemplary embodiment, both surfaces of the capacitor body 110 opposing each other in the Z direction will be defined as first and second surfaces S1 and S2, respectively, both surfaces of the capacitor body 110 opposing each other in the X direction while connecting the first and second surfaces S1 and S2 will be defined as third and fourth surfaces S3 and S4, respectively, and both surfaces of the capacitor body 110 opposing each other in the Y direction will be defined as fifth and sixth surfaces S5 and S6, respectively.

Hereinafter, in the present exemplary embodiment, a description will be provided on the assumption that amounting surface of the multilayer capacitor 100 is the first surface S1 of the capacitor body 110.

Here, a thickness of the capacitor body 110 in the Z direction may be greater than a width thereof in the Y direction. Therefore, it may be easier to design the internal electrode and the ESL control pattern so as to be simultaneously disposed on a single dielectric layer, to be described below.

The dielectric layer 111 may contain a ceramic material having high permittivity, for example, a barium titanate ($BaTiO_3$) based ceramic powder, or the like, but the material of the dielectric layer is not limited thereto as long as sufficient capacitance may be obtained.

In addition, the dielectric layer 111 may further contain various ceramic additives such as transition metal oxides or carbides, a rare earth element, magnesium (Mg), aluminum (Al), or the like, an organic solvent, a plasticizer, a binder, a dispersant, and the like, in addition to the ceramic powder, as needed.

Further, covers 112 and 113 may be disposed on both outermost portions of the capacitor body 110 in the Y direction, respectively.

The covers 112 and 113 may have the same material and configuration as those of the dielectric layer 111 except that internal electrodes are not included therein.

Further, the covers 112 and 113 may be formed by stacking one or two or more dielectric layers on both outermost portions of the capacitor body 110 in the width direction, respectively, and may generally serve to prevent the first and second internal electrodes 121 and 122 from being damaged by physical or chemical stress.

The first and second external electrodes 131 and 132 may include first and second connection portions 131a and 132a, formed on the third and fourth surfaces S3 and S4 of the capacitor body 110, and first and second band portions 131b and 132b, extended from the first and second connection portions 131a and 132a to portions of the first surface S1 of the capacitor body 110, respectively.

Here, the first and second band portions 131b and 132b may also be extended to portions of the second surface S2 of the capacitor body 110, respectively.

The first and second external electrodes 131 and 132 as described above may be formed of a conductive paste containing a conductive metal. The conductive metal may be nickel (Ni), copper (Cu), tin (Sn), or an alloy thereof, but is not limited thereto.

The conductive paste may further contain an insulating material. The insulating material may be, for example, glass, but is not limited thereto.

In addition, a method of forming the first and second external electrodes 131 and 132 is not particularly limited. That is, the first and second external electrodes 131 and 132 may be formed by dipping the capacitor body 110. If necessary, the first and second external electrodes 131 and 132 may be formed using another method such as a plating method, or the like.

Furthermore, first and second plating layers (not illustrated) may be formed on the first and second external electrodes 131 and 132.

The first and second plating layers may include nickel (Ni) plating layers formed on the first and second external electrodes 131 and 132 and tin (Sn) plating layers formed on the nickel plating layers.

The purpose of the first and second plating layers as described above is to increase adhesion strength between the multilayer capacitor 100 and a circuit board at the time of mounting the multilayer capacitor 100 on the circuit board, or the like, by solder. The plating may be performed by a method known in the art, and lead-free plating may be preferable in consideration of eco-friendly factors, but the plating method is not limited thereto.

The first and second internal electrodes 121 and 122, which are electrodes having different polarities from each other, may be formed on at least one surface of the dielectric layer 111, stacked to overlap each other in the Y direction, and alternately exposed to the third and fourth surfaces S3 and S4 of the capacitor body 110, with each of the dielectric layers 111 interposed therebetween, in the capacitor body 110.

A portion of the first internal electrode 121 exposed to the third surface S3 of the capacitor body 110 may contact the first connection portion 131a of the first external electrode 131 to thereby be electrically connected thereto, and a portion of the second internal electrode 122 exposed to the fourth surface S4 of the capacitor body 110 may contact the second connection portion 132a of the second external electrode 132 to thereby be electrically connected thereto.

In this case, the first and second internal electrodes 121 and 122 may be electrically insulated from each other by the dielectric layer 111 disposed therebetween, and capacitance of the multilayer capacitor 100 may be in proportion to an overlapping area between the first and second internal electrodes 121 and 122 in a stacking direction of the dielectric layers 111 except for the portions of the first and second internal electrodes exposed to the third and fourth surfaces S3 and S4 of the capacitor body 110.

In addition, the first and second internal electrodes 121 and 122 may be formed of a conductive metal, for example, one of silver (Ag), palladium (Pd), platinum (Pt), nickel (Ni), and copper (Cu), an alloy thereof, or the like, but the material of the first and second internal electrodes 121 and 122 is not limited thereto.

The first and second ESL control patterns 141 and 142 may be alternately formed on at least one surface of the same dielectric layers 111 as those on which the first and second internal electrodes 121 and 122 are formed in the capacitor body 110, respectively, but may be positioned to be closer to the first surface S1, the mounting surface, of the capacitor body 110 than to the first and second internal electrodes 121 and 122. As such, the first and second ESL control patterns 141 and 142 may be positioned in a lower portion of the capacitor body 110, as seen in the accompanying drawing.

Further, the first and second ESL control patterns 141 and 142 may be exposed to the first surface S1 of the capacitor body 110, respectively, and exposed portions thereof may contact the first band portion 131b of the first external electrode 131 and the second band portion 132b of the second external electrode 132, to thereby be electrically connected thereto, respectively.

In addition, the first and second ESL control patterns 141 and 142 may be formed to have an area smaller than that of the first and second internal electrodes 121 and 122, respectively.

Here, the overlapping area between the first and second internal electrodes 121 and 122 may be equal to or larger than 5 times the area of the first and second ESL control patterns 141 and 142.

Therefore, the capacitance of the multilayer capacitor 100 may be sufficiently secured, and there may be a large difference in resonance frequencies formed by two capacitor parts respectively formed by the internal electrodes and the ESL control patterns.

The first and second ESL control patterns 141 and 142 as described above may be formed of a conductive metal, for example, one of silver (Ag), palladium (Pd), platinum (Pt), nickel (Ni), and copper (Cu), an alloy thereof, or the like, but the material of the first and second ESL control patterns 141 and 142 is not limited thereto.

In addition, the first and second ESL control patterns 141 and 142 may include third and fourth body portions 141a and 142a, disposed to face the first and second internal electrodes 121 and 122 in the Z direction and overlapping each other, and third and fourth lead portions 141b and 142b, extended from the third and fourth body portions 141a and 142a toward the first surface S1, the mounting surface, of the capacitor body 110. The third and fourth lead portions 141b and 142b are disposed on the dielectric layers 111 so as to be spaced apart from the third and fourth surfaces S3 and S4 on which the first and second internal electrodes 121 and 122 are exposed in the capacitor body 110, respectively.

In the multilayer capacitor according to the present exemplary embodiment, the internal electrodes and the equivalent series inductance (ESL) control patterns may be formed on upper and lower portions of the same dielectric layers, respectively, but the internal electrode may have an area larger than that of the ESL control pattern, to serve to implement capacitance, and the ESL control pattern is exposed to the mounting surface of the capacitor body to implement relatively low ESL.

Further, the internal electrode and the ESL control pattern may be perpendicularly stacked and the ESL control pattern may be positioned to be closer to the mounting surface than the internal electrode, thereby significantly decreasing ESL while maintaining capacitance at a predetermined level.

That is, high capacitance may be implemented by flowing a current in both of the two capacitor parts respectively formed by the internal electrodes and the ESL control patterns at a low frequency, and low ESL characteristics and flat impedance characteristics may be implemented due to a structure in which the ESL control pattern is positioned to be adjacent to the mounting surface at a high frequency.

Therefore, the multilayer capacitor according to the present exemplary embodiment may be suitable for being used as a decoupling capacitor of a power distribution network (PDN) of a microprocessor unit (MPU), and may maintain constant impedance in the vicinity of a resonance frequency while increasing the ESR of the entire capacitor.

Modified Exemplary Embodiment

The first and second internal electrodes according to the present disclosure may have various shapes.

Figure 4A:
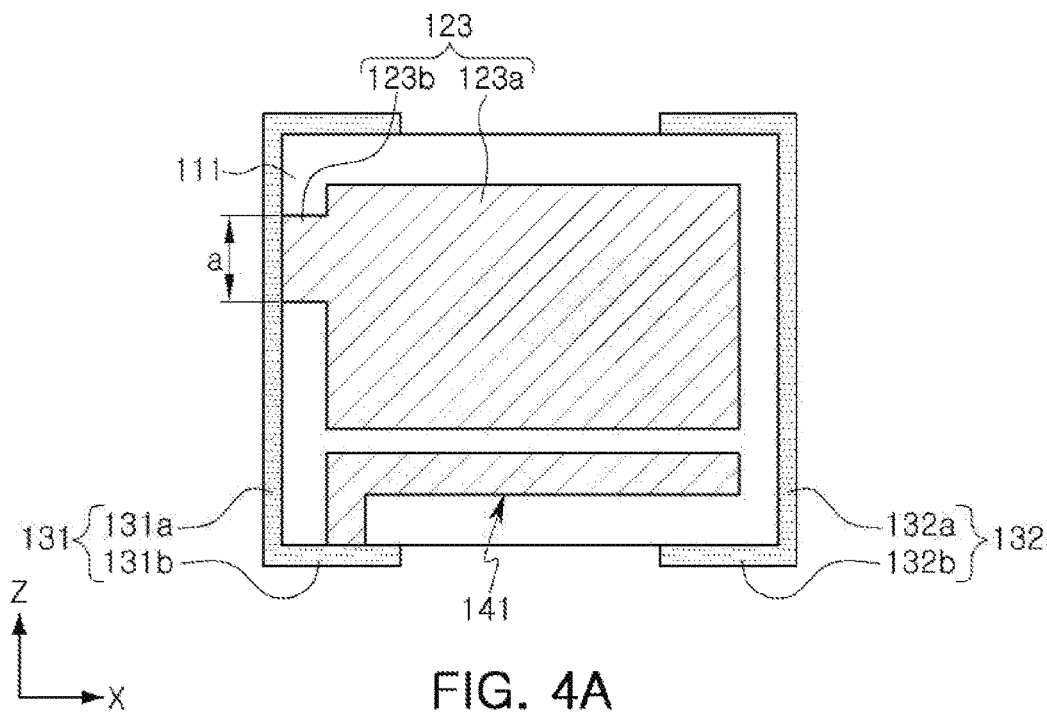
FIGS. 4A and 4B are cross-sectional views illustrating first and second internal electrodes of a multilayer capacitor according to another exemplary embodiment in the present disclosure.
Figure 4B:
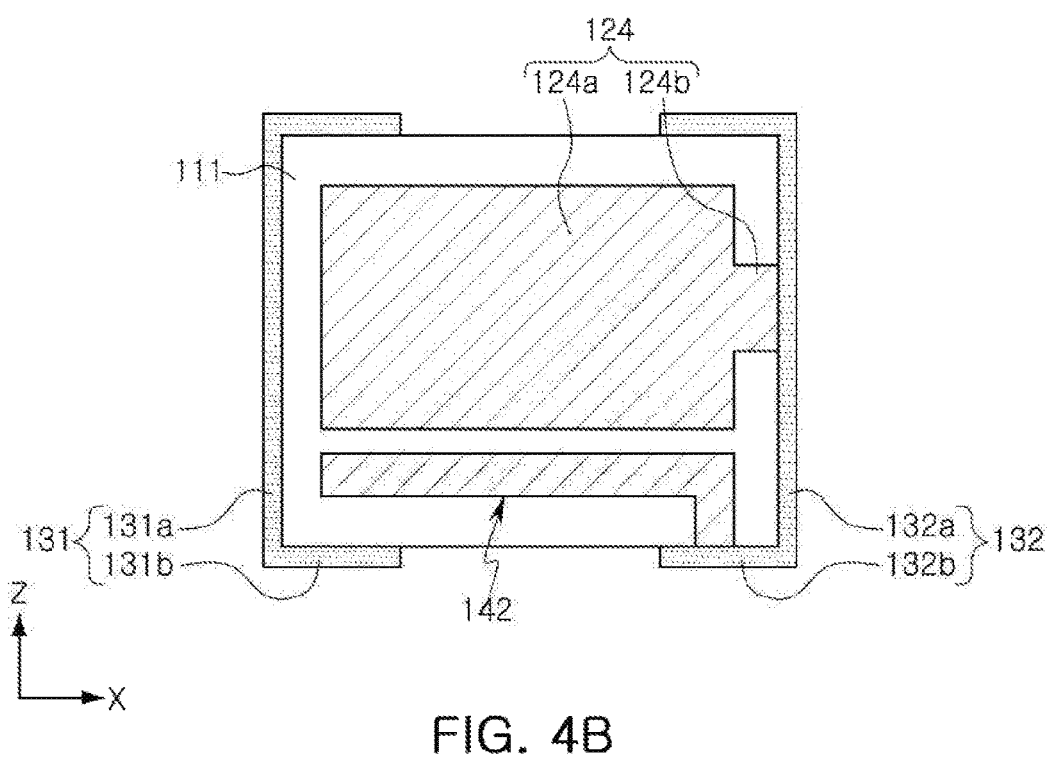

FIGS. 4A and 4B are cross-sectional views illustrating first and second internal electrodes 123 and 124 of a multilayer capacitor according to another exemplary embodiment in the present disclosure.

Here, since structures of a capacitor body 110, first and second external electrodes 131 and 132, and first and second ESL control patterns 141 and 142 are the same as those in the above-mentioned exemplary embodiment, a detailed description thereof will be omitted in order to avoid redundancy. Here, first and second internal electrodes 123 and 124, as illustrated in FIGS. 4A and 4B, having structures different from those in the above-mentioned exemplary embodiment, will be described in detail.

The first and second internal electrodes 123 and 124 may include first and second body portions 123a and 124a overlapping each other, and first and second lead portions 123b and 124b, exposed from the first and second body portions 123a and 124a to third and fourth surfaces S3 and S4 of the capacitor body 110, to thereby be electrically connected to the first and second external electrodes 131 and 132, respectively.

Here, the first and second lead portions 123b and 124b may contact first and second connection portions 131a and 132a of the first and second external electrodes 131 and 132, respectively.

In a case of configuring the internal electrode in a structure including the body portion and the lead portion having a width narrower than that of the body portion, the ESR of the multilayer capacitor may be controlled.

In addition, the first and second lead portions 123b and 124b may be positioned to be closer to a second surface S2 of the capacitor body 110 than to a central portion of the capacitor body 110 in the Z direction. Therefore, impedance characteristics may be more stably implemented.

Figure 5A:
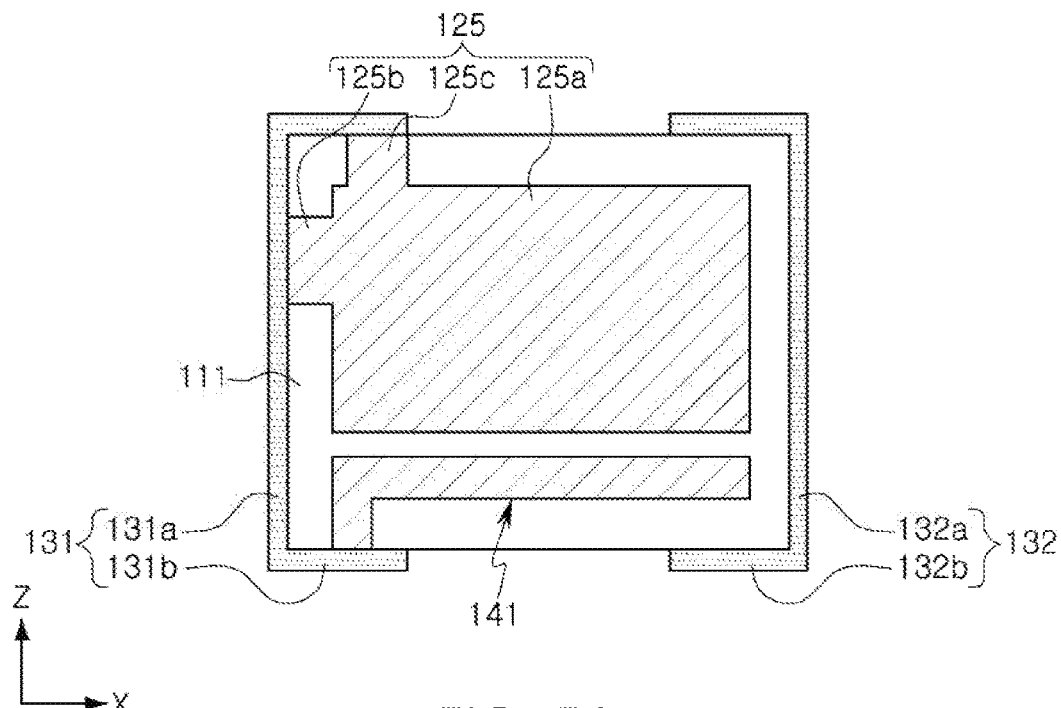
FIGS. 5A and 5B are cross-sectional views illustrating first and second internal electrodes of a multilayer capacitor according to another exemplary embodiment in the present disclosure.
Figure 5B:
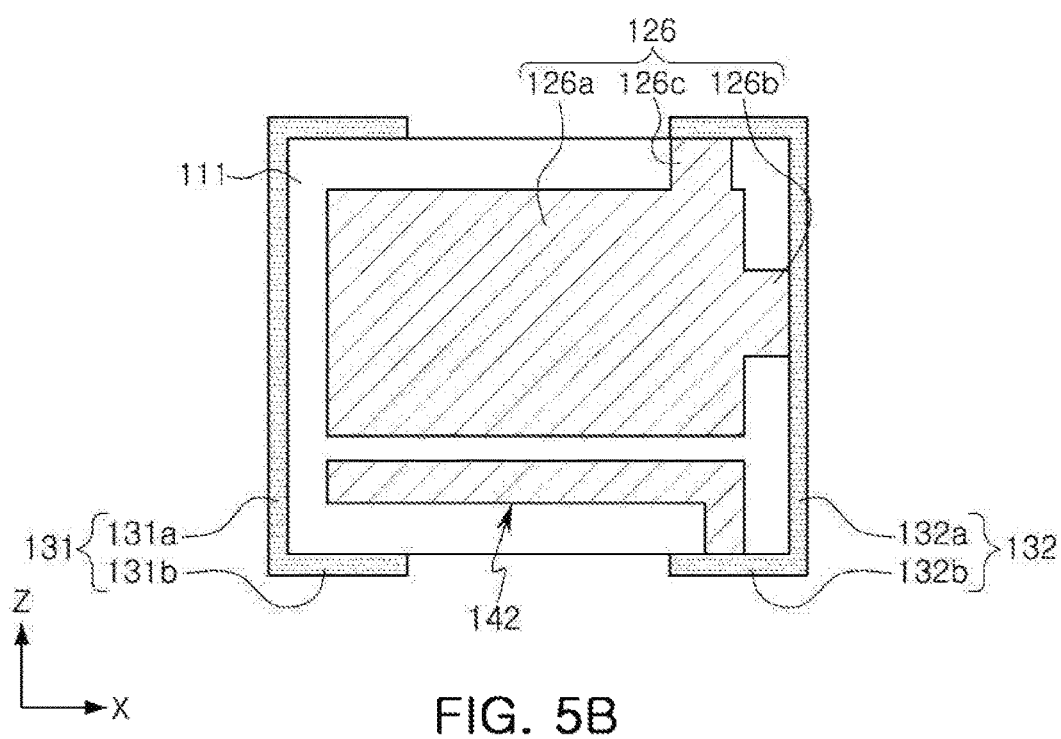

FIGS. 5A and 5B are cross-sectional views illustrating first and second internal electrodes 125 and 126 of a multilayer capacitor according to another exemplary embodiment in the present disclosure.

Here, since structures of a capacitor body 110, first and second external electrodes 131 and 132, and first and second ESL control patterns 141 and 142 are the same as those in the above-mentioned exemplary embodiment, a detailed description thereof will be omitted in order to avoid redundancy. Here, first and second internal electrodes 125 and 126, as illustrated in FIGS. 5A and 5B, having structures different from those in the above-mentioned exemplary embodiment, will be described in detail.

The first and second internal electrodes 125 and 126 may include first and second body portions 125a and 126a overlapping each other, and first and second lead portions exposed from the first and second body portions 125a and 126a to at least one surface of the capacitor body 110, to thereby be electrically connected to the first and second external electrodes 131 and 132, respectively.

The first lead portion may be exposed to one surface of the capacitor body 110 in the length direction and to a surface of the capacitor body 110 opposing a mounting surface thereof, and the second lead portion may be exposed to the other surface of the capacitor body 110 in the length direction and to the surface of the capacitor body 110 opposing the mounting surface thereof.

That is, the first lead portion may include a first lead pattern 125b exposed to a third surface S3 of the capacitor body 110 in the length direction and a second lead pattern 125c exposed to a second surface S2, the surface of the capacitor body 110 opposing the mounting surface thereof, while the second lead portion may include a third lead pattern 126b exposed to a fourth surface S4 of the capacitor body 110 in the length direction and a fourth lead pattern 126c exposed to the second surface S2, the surface of the capacitor body 110 opposing the mounting surface thereof.

Here, the first and third lead patterns 125b and 126b may contact first and second connection portions 131a and 132a of the first and second external electrodes 131 and 132, respectively, and the second and fourth lead patterns 125c and 126c may contact first and second band portions 131b and 132b, positioned on upper portions of the first and second external electrodes 131 and 132, respectively.

The ESR and ESL of the multilayer capacitor may be adjusted by adjusting a contact position and area between the lead portion and the external electrode, as described above.

Figure 6A:
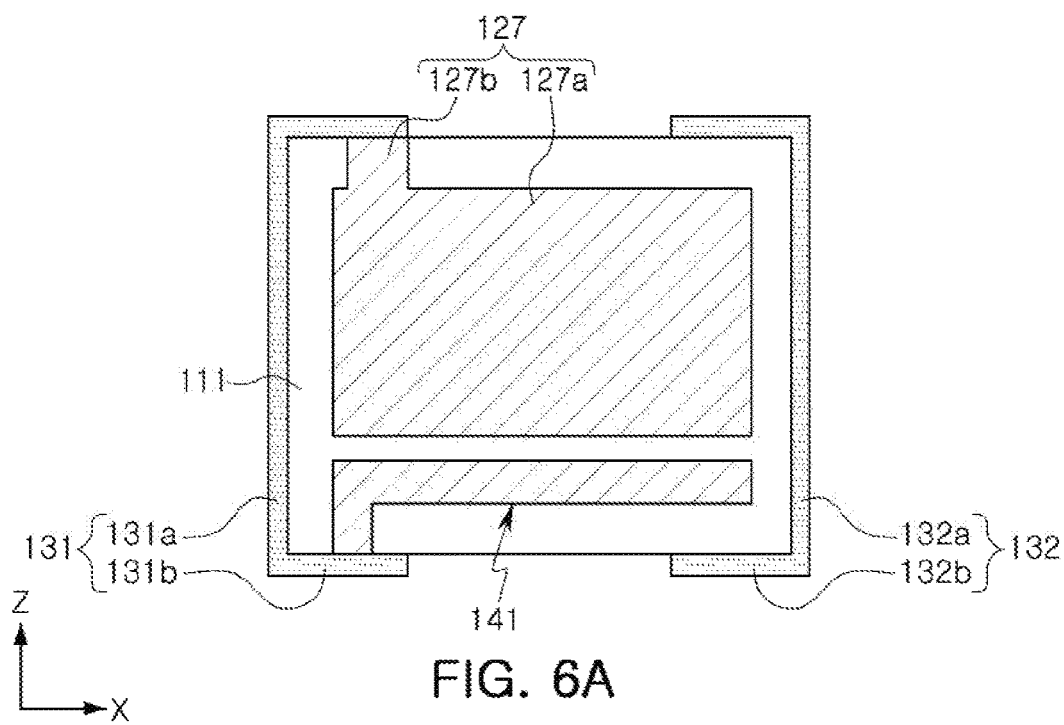
FIGS. 6A and 6B are cross-sectional views illustrating first and second internal electrodes of a multilayer capacitor according to another exemplary embodiment in the present disclosure.
Figure 6B:
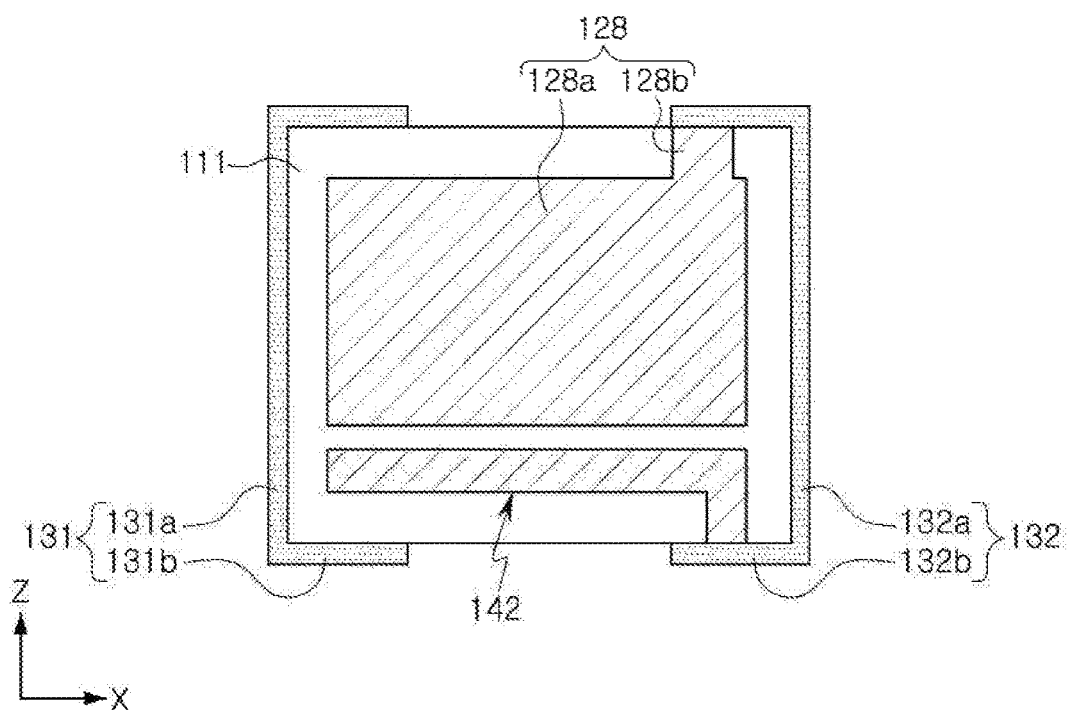

FIGS. 6A and 6B are cross-sectional views illustrating first and second internal electrodes of a multilayer capacitor according to another exemplary embodiment in the present disclosure.

Here, since structures of a capacitor body 110, first and second external electrodes 131 and 132, and first and second ESL control patterns 141 and 142 are the same as those in the above-mentioned exemplary embodiment, a detailed description thereof will be omitted in order to avoid redundancy. Here, first and second internal electrodes 127 and 128, as illustrated in FIGS. 6A and 6B, having structures different from those in the above-mentioned exemplary embodiment, will be described in detail.

The first and second internal electrodes 127 and 128 may include first and second body portions 127a and 128a overlapping each other, and first and second lead portions 127b and 128b exposed from the first and second body portions 127a and 128a to a second surface S2 of the capacitor body 110, to thereby be electrically connected to the first and second external electrodes 131 and 132, respectively.

Here, the first and second lead portions 127b and 128b may contact first and second band portions 131b and 132b of upper portions of the first and second external electrodes 131 and 132, respectively.

The ESR and ESL of the multilayer capacitor may be adjusted by adjusting a contact position and area between the lead portion and the external electrode, as described above.

In a case in which the first and second lead portions 127b and 128b of the first and second internal electrodes 127 and 128 are exposed to the second surface S2, as in the present exemplary embodiment, a surface of the capacitor body 110, opposing a mounting surface thereof, as described above, has distances from the lead portions 141b and 142b of the first and second ESL control patterns 141 and 142 that are relatively increased, such that impedance may be more stably implemented in portions in which the first and second ESL control patterns 141 and 142 are positioned.

Figure 7:
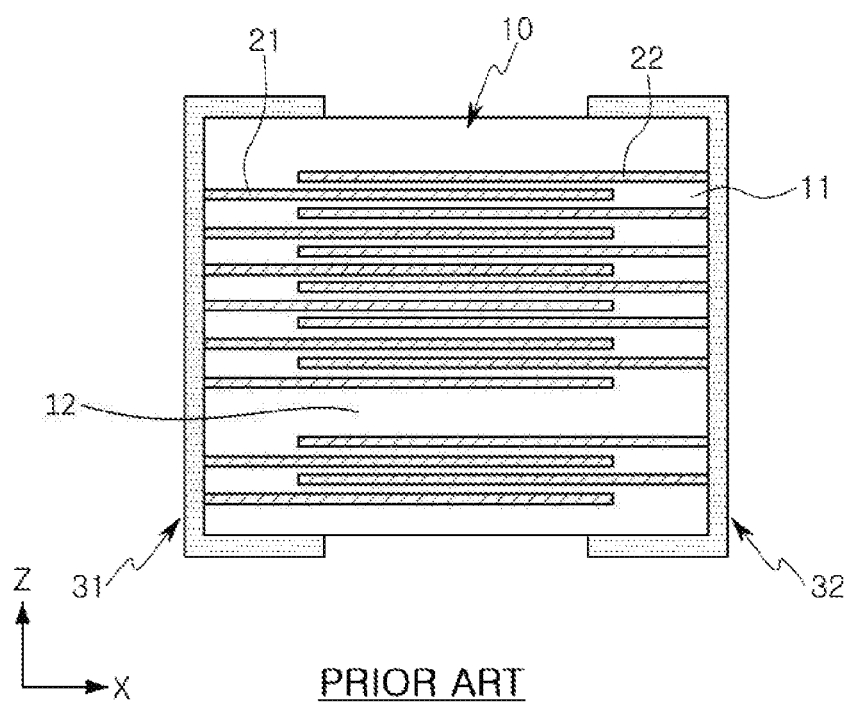
FIG. 7 is a cross-sectional view illustrating a multilayer capacitor according to the related art.
Figure 8A:
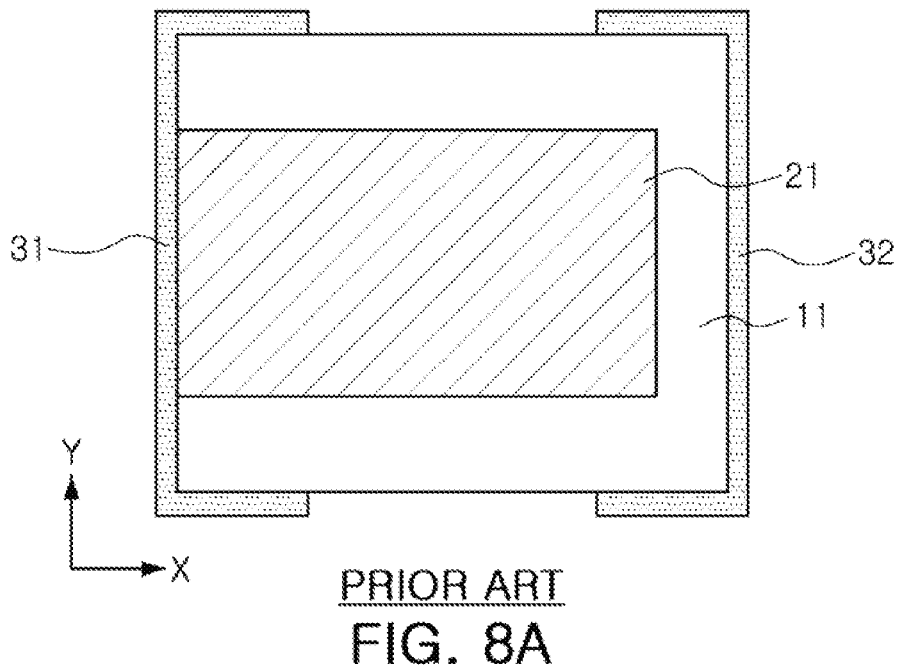
FIGS. 8A and 8B are cross-sectional views illustrating first and second internal electrodes of the multilayer capacitor of FIG. 7.
Figure 8B:
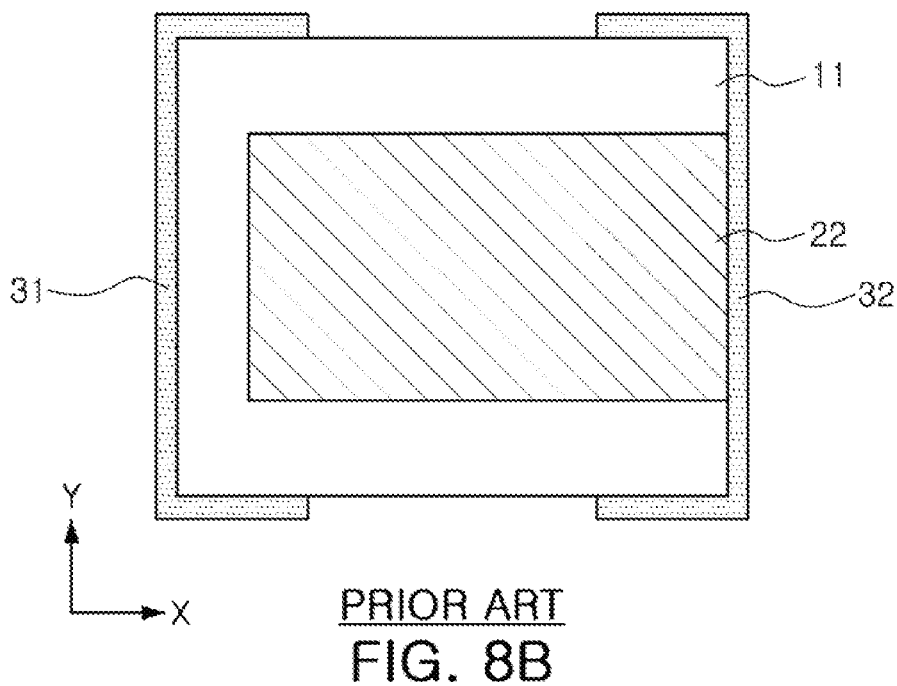

FIG. 7 is a cross-sectional view illustrating a multilayer capacitor according to the related art, and FIGS. 8A and 8B are cross-sectional views illustrating first and second internal electrodes of the multilayer capacitor of FIG. 7. Here, reference numeral 10 indicates a capacitor body, reference numeral 11 indicates a dielectric layer, and reference numerals 31 and 32 indicate external electrodes.

Referring to FIGS. 7 and 8, in order to form two capacitor parts in a single multilayer capacitor, it is possible to use a method of forming two capacitor parts having different capacitances by allowing the numbers of internal electrodes 21 and 22 stacked in the two capacitor parts to be different from each other, as illustrated in FIG. 7, and by forming a buffer layer 12 between two capacitor parts to separate the two capacitor parts from each other.

However, only when a spaced distance between the capacitor parts is long may an effect of separating two capacitor parts be exhibited, and even though two capacitor parts are formed, the ESL characteristics are similar to those of a general capacitor, such that, in view of the ESL characteristics, these two capacitor parts are insufficient to replace two capacitors.

Figure 9:
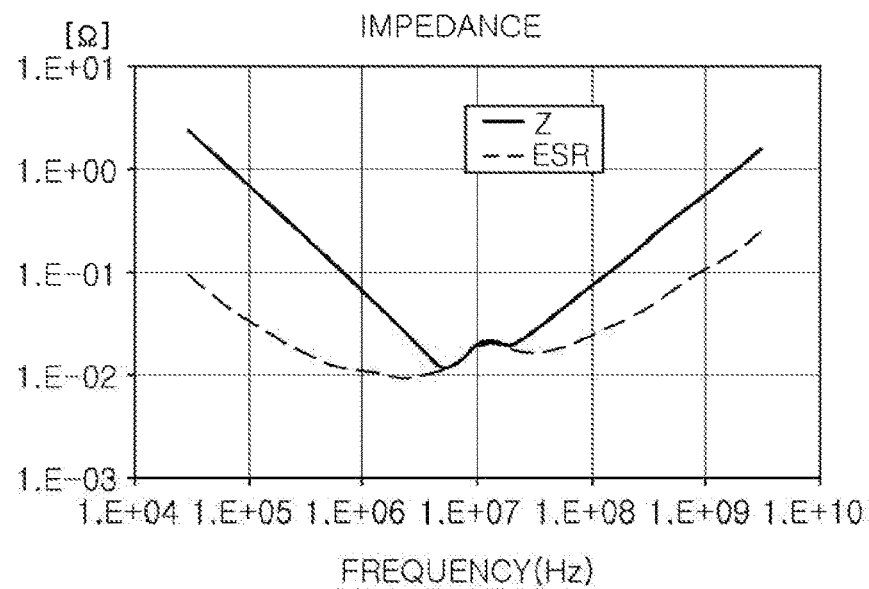
FIG. 9 is a graph illustrating changes in the ESR and ESL, depending on a frequency of the multilayer capacitor, according to the exemplary embodiment in the present disclosure.

FIG. 9 is a graph illustrating changes in the ESR and ESL, depending on a frequency of the multilayer capacitor illustrated in FIGS. 4A and 4B.

Referring to FIG. 9, it may be appreciated that resonance is generated by two capacitor parts respectively formed by the internal electrodes and the ESL control patterns, and impedance magnitudes and the ESR in two self-resonance frequencies (SRFs) and an anti-resonance point therebetween are similarly maintained.

Board Having Multilayer Capacitor

Figure 10:
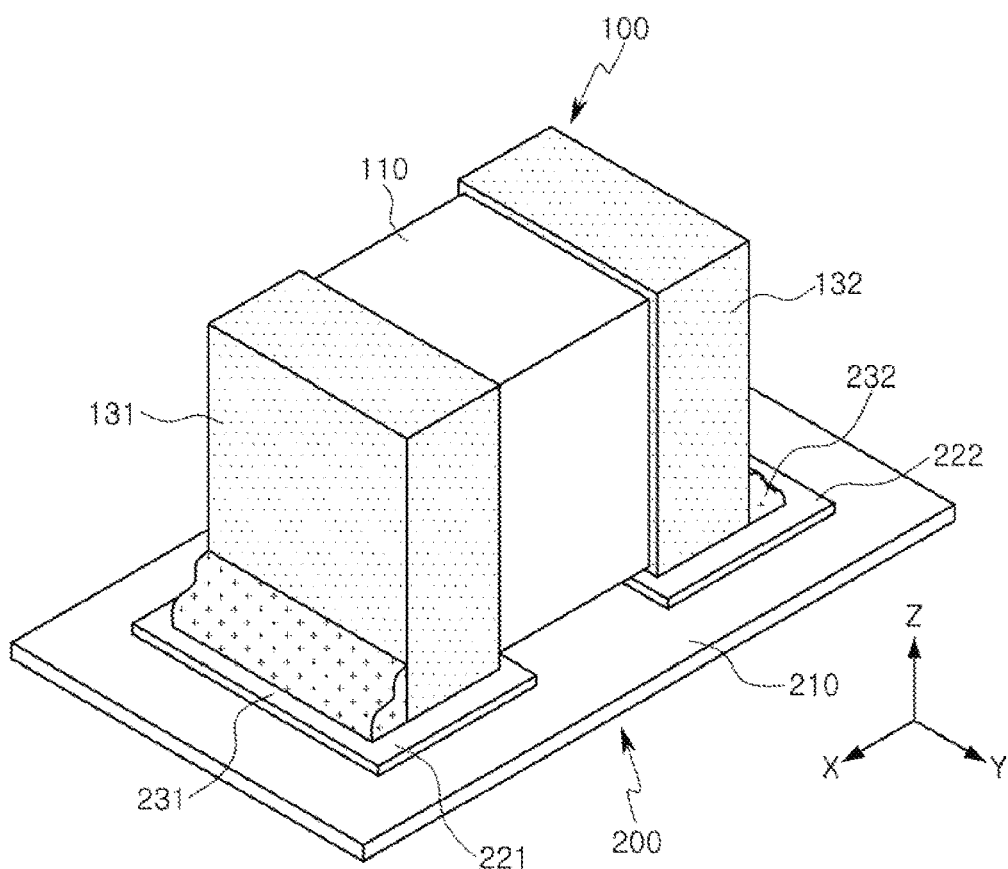
FIG. 10 is a perspective view illustrating a board in which the multilayer capacitor according to the exemplary embodiment in the present disclosure is mounted on a circuit board.

FIG. 10 is a perspective view illustrating a board in which the multilayer capacitor according to the exemplary embodiment in the present disclosure is mounted on a circuit board.

Referring to FIG. 10, a board 200 having a multilayer capacitor 100 according to the present exemplary embodiment may include a circuit board 210 on which the multilayer capacitor 100 is mounted, and first and second electrode pads 221 and 222 formed on the circuit board 210 to be spaced apart from each other.

The multilayer capacitor 100 may be electrically connected to the circuit board 210 by solders 231 and 232, in a state in which the first and second external electrodes 131 and 132 are positioned to contact the first and second electrode pads 221 and 222, respectively.

As set forth above, according to exemplary embodiments in the present disclosure, the number of capacitors mounted on the circuit board may be decreased by improving the characteristics of two capacitors using the internal electrodes and the ESL control patterns disposed in the single capacitor body, such that a mounting space and cost may be decreased due to a decrease in the number of components. In addition, an impedance peak caused by the anti-resonance may be decreased as compared to a case of using a plurality of capacitors, such that desired impedance required for an IC operation may be easily controlled in a wider frequency region.

While exemplary embodiments have been shown and described above, it will be apparent to those skilled in the art that modifications and variations could be made without departing from the scope of the present invention, as defined by the appended claims.

What is claimed is:

1. A multilayer capacitor comprising:
a capacitor body including a plurality of dielectric layers stacked in a direction perpendicular to a mounting surface of the capacitor body;
first and second external electrodes extending from opposing surfaces of the capacitor body in a length direction to portions of the mounting surface of the capacitor body, respectively;
a plurality of first and second internal electrodes disposed to face each other, with at least one of the dielectric layers interposed therebetween in the capacitor body, and electrically connected to the first and second external electrodes, respectively; and
a plurality of first and second equivalent series inductance (ESL) control patterns disposed at positions closer to the mounting surface of the capacitor body than the first and second internal electrodes, respectively, to face each other, with at least one of the dielectric layers interposed therebetween in the capacitor body, and exposed to the mounting surface of the capacitor body, to thereby be electrically connected to the first and second external electrodes, respectively,
wherein the first and second internal electrodes have an area larger than that of the first and second ESL control patterns, respectively, and
wherein at least one of the first or second internal electrodes and at least one of the first or second ESL control patterns, respectively, are disposed on a same dielectric layer of the dielectric layers.

2. The multilayer capacitor of claim 1, wherein the first and second internal electrodes include first and second body portions overlapping each other, and first and second lead portions exposed from the first and second body portions to at least one surface of the capacitor body to thereby be electrically connected to the first and second external electrodes, respectively.

3. The multilayer capacitor of claim 2, wherein the first and second lead portions are exposed to opposite surfaces of the capacitor body in the length direction, respectively.

4. The multilayer capacitor of claim 2, wherein the first lead portion is exposed to one surface of the capacitor body in the length direction and a surface of the capacitor body opposing the mounting surface thereof, and the second lead portion is exposed to the other surface of the capacitor body in the length direction and the surface of the capacitor body opposing the mounting surface thereof.

5. The multilayer capacitor of claim 2, wherein the first lead portion includes a first lead pattern exposed to one surface of the capacitor body in the length direction and a second lead pattern exposed to a surface of the capacitor body opposing the mounting surface thereof, and the second lead portion includes a third lead pattern exposed to the other surface of the capacitor body in the length direction and a fourth lead pattern exposed to the surface of the capacitor body opposing the mounting surface thereof.

6. The multilayer capacitor of claim 2, wherein the first and second lead portions are exposed to a surface of the capacitor body opposing the mounting surface thereof, respectively.

7. The multilayer capacitor of claim 1, wherein the first and second ESL control patterns include third and fourth body portions formed to face the first and second internal electrodes in a thickness direction; and third and fourth lead portions extended from the third and fourth body portions to the mounting surface of the capacitor body.

8. The multilayer capacitor of claim 1, wherein the first and second ESL control pattern include third and fourth body portions formed to face the first and second internal electrodes in a thickness direction; third and fourth lead portions extended from the third and fourth body portions to the mounting surface of the capacitor body; and the third and fourth lead portions are disposed on the dielectric layers so as to be spaced apart from a surface on which the first and second internal electrodes are exposed in the capacitor body, respectively.

9. A board having a multilayer capacitor, the board comprising:
a circuit board on which first and second electrode pads are formed; and
the multilayer capacitor of claim 1, mounted on the circuit board so that the first and second external electrodes are disposed on the first and second electrode pads, respectively.

* * * * *